(12) United States Patent
Darwish (10) Patent No.: US 11,764,455 B2
(45) Date of Patent: Sep. 19, 2023

(54) HYBRID COUPLER-BASED ELECTRICAL POWER SWITCHES AND POWER COMBINING CIRCUITS USING TIME FOLDING

(71) Applicant: U.S. Army Combat Capabilities Development Command, Army Research Laboratory, Adelphi, MD (US)

(72) Inventor: Ali M. Darwish, Highland, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 17/578,525

(22) Filed: Jan. 19, 2022

(65) Prior Publication Data

US 2022/0285817 A1 Sep. 8, 2022

Related U.S. Application Data (63) Continuation-in-part of application No. 17/189,864, filed on Mar. 2, 2021, now Pat. No. 11,264,980.

(51) Int. Cl.
| | |
|---|---|
| *H01P 5/19* | (2006.01) |
| *H03H 11/16* | (2006.01) |
| *H03K 17/51* | (2006.01) |
| *H03K 17/56* | (2006.01) |

(52) U.S. Cl.
CPC ............ *H01P 5/19* (2013.01); *H03H 11/16* (2013.01); *H03K 17/51* (2013.01); *H03K 17/56* (2013.01)

(58) Field of Classification Search
CPC .......... H01P 5/19; H03H 11/16; H03K 17/51; H03K 17/56
USPC ....... 327/231, 254, 255, 256, 257, 258, 355, 327/361, 407, 415, 594
See application file for complete search history.

(56) References Cited

U.S. PATENT DOCUMENTS

| | | | | |
|---|---|---|---|---|
| 3,701,950 | A * | 10/1972 | Seidel | H03H 19/00 455/256 |
| 3,883,827 | A * | 5/1975 | Seidel | H03H 7/48 333/112 |
| 4,472,691 | A | 9/1984 | Kumar | |
| 6,121,853 | A | 9/2000 | London | |
| 9,000,865 | B2 | 4/2015 | Darwish et al. | |
| 9,362,602 | B2 | 6/2016 | Darwish et al. | |
| 2003/0234687 | A1 * | 12/2003 | Zhang | H03F 1/3223 330/149 |

(Continued)

OTHER PUBLICATIONS

C. Kai and S. Cheng, "Millimeter-Wave Power-Combining Techniques," Microwave Theory and Techniques, IEEE Transactions on, vol. 31, pp. 91-107, 1983.

(Continued)

*Primary Examiner* — William Hernandez
(74) *Attorney, Agent, or Firm* — Eric B. Compton (57) ABSTRACT

Switch circuits for electrical power are formed of a hybrid coupler configured to receive a signal as an input, and output first and second pulsed wave signals along first and second signal paths, respectively; in a plurality of time frames, wherein the phases of the first and second pulsed wave signals along first and second signal paths are aligned. The switch circuits may be incorporated in time folding power circuits as an exemplary application.

20 Claims, 6 Drawing Sheets

(56) References Cited

U.S. PATENT DOCUMENTS

2008/0102763 A1* 5/2008 Yoon .................. H04B 1/525
   455/78
2009/0289744 A1* 11/2009 Miyashiro ................ H03H 7/38
   333/175
2011/0260771 A1 10/2011 Hirota

OTHER PUBLICATIONS

K. J. Russell, "Microwave Power Combining Techniques," Microwave Theory and Techniques, IEEE Transactions on, vol. 27, pp. 472-478, 1979.

S. F. Marsh, "MMIC power splitting and combining techniques," in Design of RFIC's and MMIC's (Ref. No. 1997/391), IEE Tutorial Colloquium on, 1997, p. 6/1-6/7.

R. A. York and Z. B. Popović, "Active and quasi-optical arrays for solid-state power combining," Wiley, 1997, Description only.

R. T. N.D. du Toit, J.H. Smith, F.N. Schirk and J.A. Mogel, "Design of Solid-state, Wideband, High-power Microwave Amplifiers for Radiated Immunity Testing," Microwave Journal, vol. 53, pp. 90-100, Jul. 11, 2010.

M. Cicolani and A. Panariello, "Novel Design Technique for Radial Power Combiners," in Microwave Conference, 2000. 30th European, 2000, pp. 1-4.

M. A. Gouker, "A circuit-fed, tile-approach configuration for millimeter-wave spatial power combining," in Microwave and Optoelectronics Conference, 1999. SBMO/IEEE MTT-S, APS and LEOS—IMOC '99. International, 1999, pp. 231-232.

M. A. Gouker, J. T. Delisle, and S. M. Duffy, "A circuit-fed tile-approach configuration for millimeter-wave spatial power combining," Microwave Theory and Techniques, IEEE Transactions on, vol. 50, pp. 17-21, 2002.

S. C. Ortiz, J. Hubert, L. Mirth, E. Schlecht, and A. Mortazawi, "A high-power Ka-band quasi-optical amplifier array," Microwave Theory and Techniques, IEEE Transactions on, vol. 50, pp. 487-494, 2002.

Wikipedia's "RF switch" page, available at https://en.wikipedia.org/wiki/RF_switch (accessed Mar. 1, 2021).

Fairview Microwave's product literature for 2-Way and 4-Way RF Power Combiners up to 6 GHz, available at: https://www.fairviewmicrowave.com/rf-products/power-combiners.html (accessed Mar. 1, 2021).

Mini-Circuits' product literature for the ZX10-2-12+ Coaxial Power Splitter/Combiner, available at: https://www.minicircuits.com/pdfs/ZX10-2-12+.pdf (accessed Feb. 9, 2021).

Analog Device Inc.'s product literature for the model HMC574A switch, available at: https://www.analog.com/media/en/technical-documentation/data-sheets/hmc574A.pdf (accessed Feb. 1, 2021).

David Pozar, Microwave Engineering, 4th edition, Wiley, 2011, pp. 328, 343-347, 362-372, and 585-596.

U.S. Appl. No. 17/189,864, filed Mar. 2, 2021.

* cited by examiner

Switching Scheme for Phase Shifters using a Quadrature (90 degree) Hybrid Coupler

Delay (values in degrees)

| Phase Shifter | | | | |
|---|---|---|---|---|
| 1 | 0 | 270 (-90) | 0 | 270 (-90) |
| 2 | 0 | 90 | 0 | 90 |
| | Time Frame 1 (½ Period) | Time Frame 2 (½ Period) | Time Frame 3 (½ Period) | Time Frame 4 (½ Period) |

FIG. 8A

Switching Scheme for Phase Shifters using a 180-degree Hybrid Coupler

Delay (values in degrees)

| Phase Shifter | | | | |
|---|---|---|---|---|
| 1 | 0 | 180 (0) | 0 | 180 (0) |
| 2 | 0 | 0 (180) | 0 | 0 (180) |
| | Time Frame 1 (½ Period) | Time Frame 2 (½ Period) | Time Frame 3 (½ Period) | Time Frame 4 (½ Period) |

FIG. 8B

HYBRID COUPLER-BASED ELECTRICAL POWER SWITCHES AND POWER COMBINING CIRCUITS USING TIME FOLDING

RELATED APPLICATION DATA

This application is a continuation-in-part (CIP) application of U.S. patent application Ser. No. 17/189,864 filed on Mar. 2, 2021, the disclosure of which is incorporated by reference herein in its entirety for all purposes.

GOVERNMENTAL INTEREST

The invention described herein may be manufactured, used and licensed by or for the U.S. Government.

BACKGROUND

Field

The field of the invention relates to power switching and signal combining, and more particularly to, hybrid coupler-based electrical power switches and power combining circuit using time folding using the same.

Description of Related Art

In radio frequency (RF) system and amplifier design, there is a trade-off between output power, efficiency, and heat. Even with highly efficient amplifiers, at high output powers, a considerable percentage of the input DC power is converted to heat. The added heat can degrade device performance as well as increases the cooling requirements of many RF systems, leading to increased costs and power consumption just to keep a device within its operating temperature.

Despite this difficulty, many RF applications require the use of high-power RF transmitters. This need has led to years of research and development into various methods of RF power combing to maximize the output power from many individual devices. The most straight forward method of power combination is a corporate power combining architecture. Corporate combining makes use of many identical 2-way power combiners and cascades 2' combiners. The notable drawback, however, is that the loss per combiner adds up quickly as the number of combiners increase.

Another popular method of power combing is chain-coupled power combing. This method couples the power from individual devices into a transmission line via directional couplers. Chain-coupling suffers from two major drawbacks: design complexity and coupler bandwidth.

Radial power combining was developed to elevate some of the issues with corporate and chain power combining. Radial combiners combine the power of many devices in a single stage which reduces the losses as compared to cooperate combiners and has much better bandwidth as compared to chain-coupled combiners. The trade-off is that radial combiners tend to be very large and bulky, which limits their use.

Spatial power combining is another common technique used to combine the output power of multiple devices. Spatial power combining relies on exciting a number of devices through free space which means the combining efficiency is independent of the number of combined devices. The major drawback to spatial power combination is that the output power is a traveling wave in free space, and requires an antenna to couple the power back onto a planar circuit.

While many of the prior explored techniques are able to produce large output powers, none are able to produce a peak output power greater than that of the input.

The aforementioned Ser. No. 17/189,864 application introduced time folding power combining circuits which are configured to convert a continuous wave signal into a pulsed wave signal by time folding. The time folding power combining circuits convert a continuous wave into a pulsed wave of greater peak power. Such circuits may comprise: a switch which receives a continuous wave signal as input, and outputs first and second pulsed wave signals along first and second signal paths, respectively, said switch being configured to repeatedly switch connection back and forth between the input and the outputs of the first and second signal paths in a plurality of time frames; a delay line in the second signal path configured to introduce a time delay to the second pulsed wave signal in the second signal path such that the first pulsed wave signal in the first signal path and the time-delayed second pulsed wave signal in the second signal path substantially align in the same time frames; and a combiner, which receives the first pulsed wave signal in the first signal path and the time-delayed pulsed second wave signal in the second signal path as inputs, and combines them into a single combined pulsed wave signal as output.

The '864 application described conventional switch elements like a single pole double throw (SPDT), multiple throw (SPnT) switch, bypass switch (such as a 4-port bypass switch), or any other switch which allows a single input to multiple (two or more) output paths. One exemplary commercial SPDT switch which may be used in embodiments is the model HMC574A switch available from Analog Device Inc.

SUMMARY

Switch circuits for electrical power are formed of a hybrid coupler configured to receive a signal as an input, and output first and second pulsed wave signals along first and second signal paths, respectively; in a plurality of time frames, wherein the phases of the first and second pulsed wave signals along first and second signal paths are aligned. The switch circuits may be incorporated in time folding power circuits as an exemplary application.

According to an embodiment, a switch circuit for electrical power comprises a hybrid coupler configured to receive a signal as an input, and output first and second pulsed wave signals along first and second signal paths, respectively; in a plurality of time frames, wherein the phases of the first and second pulsed wave signals along first and second signal paths are aligned. The hybrid coupler may be a quadrature (90-degree) hybrid coupler or a 180-degree hybrid coupler.

More particularly, the switch circuit may comprise an input hybrid coupler for which the continuous wave signal is one input, two output paths from the input hybrid coupler, a phase shifters in each of the two output paths, and an output hybrid coupler receiving the signals along the two output paths from the input hybrid coupler and outputs shifted signals along the first and second signal paths in a plurality of time frames.

In some implementations, another input of the input hybrid coupler is terminated to a resistive ground connection. Alternatively, a splitter may be provided to split the continuous wave signal into two continuous wave signals which are inputs to the switch.

The switch circuit may further comprise a phase adjuster provided in one or both of the two output paths to adjust the phase of the signal therein. Each phase shifter preferably is associated with or comprises a controller. To boost the signal, if desired or otherwise necessary, the switch circuit may further comprise an amplifier provided in each of the two output paths of the switch to amplify the signal therein.

According to further embodiments, a time folding power combining circuit comprising: a hybrid coupler-based electrical power switch circuit; a delay line in the second signal path configured to introduce a time delay to the second pulsed wave signal in the second signal path such that the first pulsed wave signal in the first signal path and the time-delayed second pulsed wave signal in the second signal path substantially align in the same time frames; and a combiner, which receives the first pulsed wave signal in the first signal path and the time-delayed pulsed second wave signal in the second signal path as inputs, and combines them into a single combined pulsed wave signal as an output.

In one embodiment of the time folding power combining circuit, the hybrid coupler of the switch comprises a quadrature (90 degree) hybrid coupler and the combiner comprises a quadrature (90 degree) hybrid coupler. In another embodiment of the time folding power combining circuit, the hybrid coupler of the switch comprises a 180-degree hybrid coupler and the combiner comprises a 2-to-1 combiner.

The time folding power combining circuit may further include a continuous wave generator configured to produce the continuous wave signal. The continuous wave signal may have a frequency between 1-10,000 MHz, for instance. As with the previously-described time folding power combining circuits, wherein the peak power of the single combined pulsed wave signal output is approximately twice that of the continuous wave signal input.

Similar to the previously-described time folding power combining circuits, the delay line may comprise a coaxial cable. The delay line may be bent, spooled, coiled, bundled, and/or wrapped, one or more times, between its beginning and end.

These and other embodiments of the invention are described in more detail, below.

DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only illustrative embodiments of this invention and are therefore not to be considered limiting of its scope, for the invention may admit to other equally effective embodiments.

To facilitate understanding, identical reference numerals have been used, where possible, to designate comparable elements that are common to the figures. The figures are not drawn to scale and may be simplified for clarity. It is contemplated that elements and features of one embodiment may be beneficially incorporated in other embodiments without further recitation.

DETAILED DESCRIPTION

Directional couplers can be designed for arbitrary power division, while hybrid junctions usually have equal power division. Hybrid junctions have either a 90° or a 180° phase shift between the output ports.

According to theory, there are two (and only two) types of hybrid couplers that can give you equal power division: one is the quadrature (90-degree) hybrid coupler and the other is the 180-degree hybrid coupler. I will first discus the quadrature (90-degree) hybrid coupler.

The quadrature (90-degree) hybrid coupler is a well-known 4-port microwave component that divide (or combine) signals. The coupler has four ports 1, 2, 3, and 4. Many microwave textbooks contain detailed discussions on the properties and construction of quadrature hybrid couplers, see, for example: *Microwave Engineering*, by David Pozar, 4th edition, Wiley, 2011, Section 7.5, the Quadrature (90 degree) Hybrid, page 343-347, herein incorporated by reference.

In the quadrature (90-degree) hybrid coupler, ports 1, and 2 are used as inputs, $In_1$, and $In_2$, respectively, while ports 3, and 4 are used as outputs, $Out_1$, and $Out_2$, respectively. Typically, the ports are named as follows: Port 1 is named the input port, Port 2 is named the isolated port, Port 3 is named the through port, and Port 4 is named the coupled port. If we have a 3-dB hybrid coupler (i.e. it divides the signal equally), then an input signal on $In_1$ gets split equally between $Out_1$, and $Out_2$. The only difference is that $Out_1$, and $Out_2$ will have different phases. Similarly, an input signal on $In_2$ gets split equally between $Out_1$, and $Out_2$. Again, $Out_1$, and $Out_2$ will have different phases. For a quadrature coupler, the phase difference between $Out_1$, and $Out_2$ will be 90 degrees, hence the name quadrature. To use the quadrature hybrid coupler as a power divider an input $In_1$ is split equally between $Out_1$, and $Out_2$. On the other hand, one also can use the quadrature hybrid coupler as a power combiner by having two equal signals $In_1$, and $In_2$ (where $In_2$ has a 90 degrees phase shift from $In_1$) and obtain the sum at port $Out_2$.

There exists a so-called balanced amplifier circuit which incorporates input and output quadrature (90-degree) hybrid couplers. See Pozar (2011), Section 12.4 on page 585, herein incorporated by reference. This balanced amplifier circuit includes two identical amplifiers and two 90-degree hybrid couplers to cancel input and output reflection from the two amplifiers. More particularly, the first hybrid coupler divides the input signal into two components with a 90° phase difference. The divided signals are amplified by the two amplifiers. The second coupler then recombines the amplifier outputs imposing an additional 90° phase difference. With this circuit, reflections from the amplifiers inputs cancel at the input to the output hybrid coupler. This results in an improved impedance match. Another relevant microwave component is a power divider. A power divider takes an input signal and divides it equally into two (or more) outputs. An example of that is the Wilkinson power divider. See Pozar (2011), Section 7.3 on page 328, herein incorporated by reference.

I modify this circuit and use the modified circuit as a switching element in various embodiments.

Figure 1:
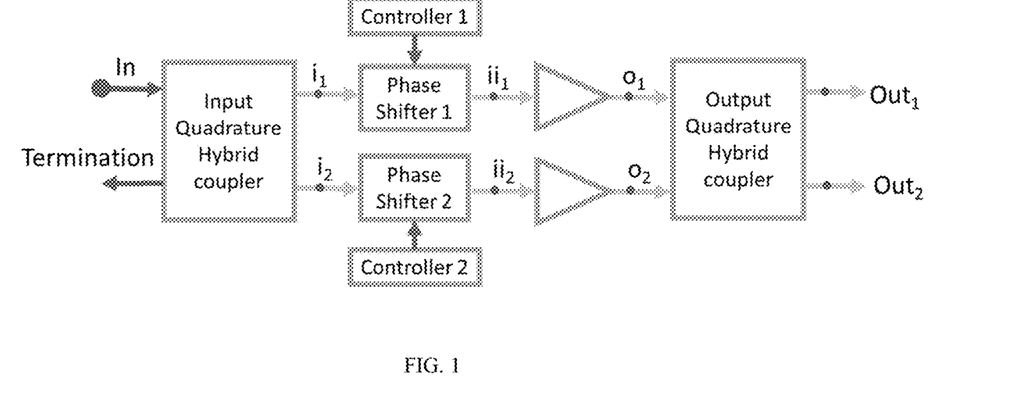
FIG. 1 shows a switch circuit for electrical power comprised of two quadrature (90-degree) hybrid couplers according to an embodiment.

FIG. 1 shows a switching circuit for electrical power comprised of two quadrature (90-degree) hybrid couplers according to one embodiment. In it, an input quadrature hybrid coupler with input signal "In" divides the signal into $i_1$, and $i_2$. Then they pass through phase shifters 1, and 2, and become $ii_1$, and $ii_2$, respectively. After that, two identical amplifiers (which are optional) are used to amplify signals $ii_1$, and $ii_2$, to $o_1$, and $o_2$, respectively. Then, an output quadrature hybrid coupler combines $o_1$, and $o_2$. If phase shifters 1, and 2, do not change the relative phase of $i_1$, and $i_2$, then the sum of signals $o_1$, and $o_2$ are combined at $Out_2$. If however, phase shifters 1, and 2, change the relative phase of $i_1$, or $i_2$, by 180 degrees, then the sum of signals $o_1$, and $o_2$ are combined at $Out_1$. Hence, one can switch the output between $Out_1$, and $Out_2$ by setting the relative phase of phase shifters 1, and 2. It is customary not to leave any unused coupler ports open. Instead, they are usually terminated with a resistor, such as a 50-ohm resistor, to reduce signal reflections as shown in the input quadrature hybrid coupler.

Figure 2:
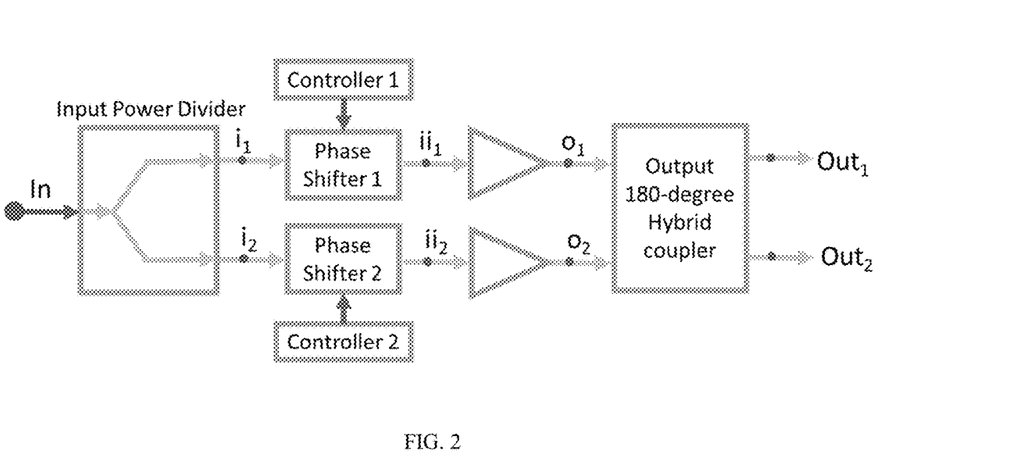
FIG. 2 shows a switch circuit for electrical power comprised of a single hybrid 180-degree coupler according to an embodiment.

The same switching action can be achieved using a single hybrid 180-degree coupler. The 180-degree hybrid coupler is a 4-port hybrid coupler. See Pozar (2011), Section 7.8 on pages 362-372, herein incorporated by reference. It takes two inputs ($In_1$, and $In_2$) and produces two outputs ($Out_1$ and $Out_2$). However, unlike the quadrature hybrid coupler, $Out_1$ equals $In_1+In_2$ while $Out_2$ equals $In_1-In_2$. As such, if we phase shift $In_2$ by 180 degrees (to produce $-In_2$), then $Out_1$ will equal $In_1+(-In_2)$ while $Out_2$ will equal $In_1-(-In_2)$; which reverses the role of $Out_1$ and $Out_2$. If $In_1$, and $In_2$ have equal amplitude and phase, then if we sum them (say, at $Out_1$) we get the total power of the input signals and if we subtract them (say, at $Out_2$) we get zero. Once we phase shift one of them by 180 degrees, then the sum signal will switch output ports (from $Out_1$ to $Out_2$ or vice versa).

FIG. 2 shows an alternative embodiment of such a switching circuit. Here, the input quadrature hybrid coupler is replaced with an input power divider (such as a Wilkinson power divider). The input power divider receives an input signal "In" and divides it to $i_1$, and $i_2$, where $i_1$ and $i_2$ have equal amplitude and phase. The rest of the circuit is similar to that in FIG. 1. Again, one can switch the output between $Out_1$, and $Out_2$ by setting the relative phase of phase shifters 1, and 2. The phase-shifting speed is what sets the switching speed since the rest of components (e.g. couplers and amplifiers) are almost instantaneous. The phase-shifting speed depends on the type of phase shifter. However, in most cases one can achieve phase-shifting in less than 1 nanosecond. A SPDT, by comparison, usually takes ten (or more) nanoseconds to switch.

Figure 3A:
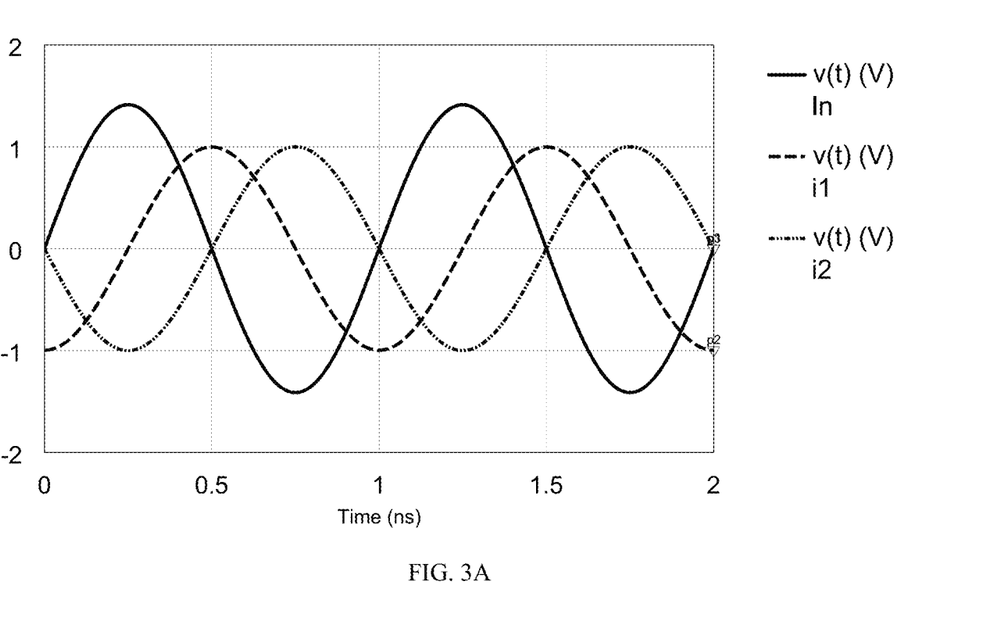
FIGS. 3A-D show an example of the time domain waveforms used in the switch circuit in FIG. 1.
Figure 3B:
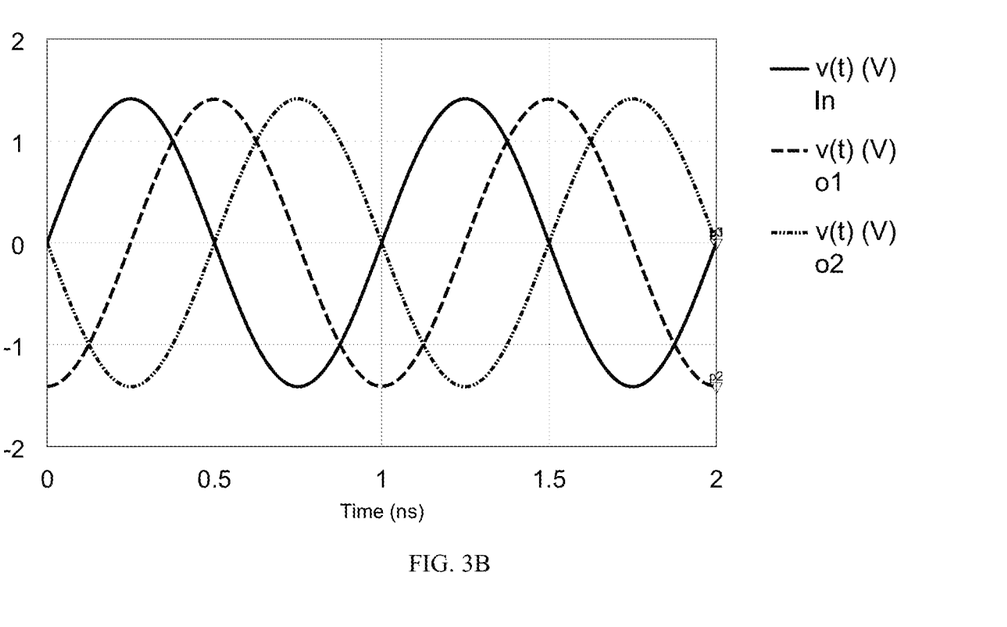

FIGS. 3A-D show an example of the time domain waveforms used in the circuit in FIG. 1. In FIG. 3A, the "In" signal is shown along with signals $i_1$, and $i_2$. As can be seen, there is a 90-degree phase-shift between $i_1$, and $i_2$ due to the input quadrature hybrid coupler. We can assume, for simplicity of explanation, that $i_1$ is 0 degrees and $i_2$ is 90 degrees; but other phases are possible.

Figure 3C:
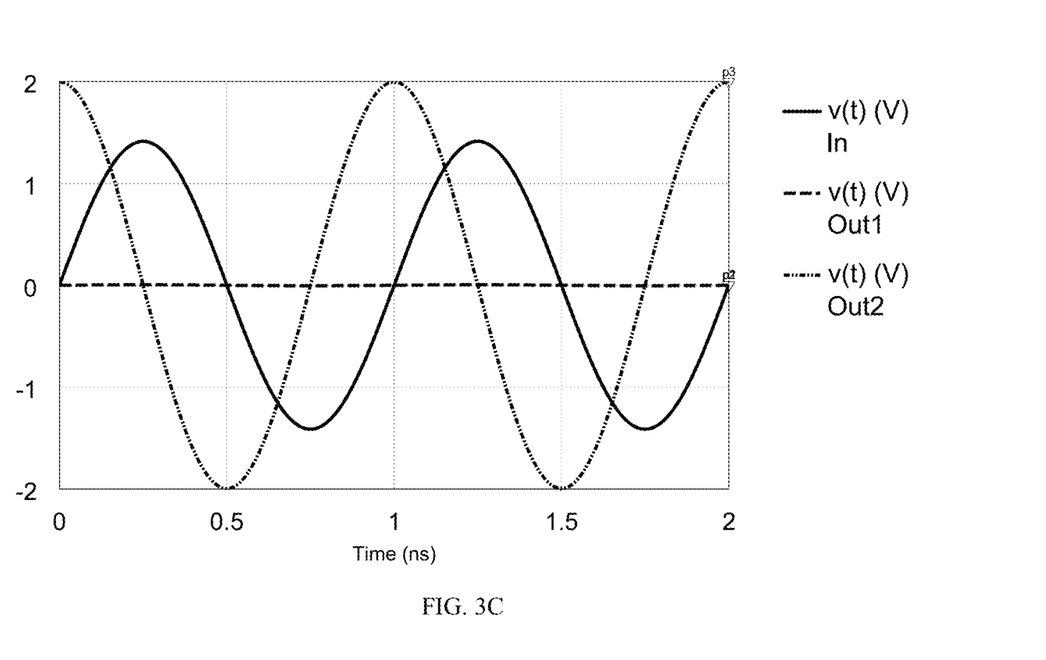
Figure 3D:
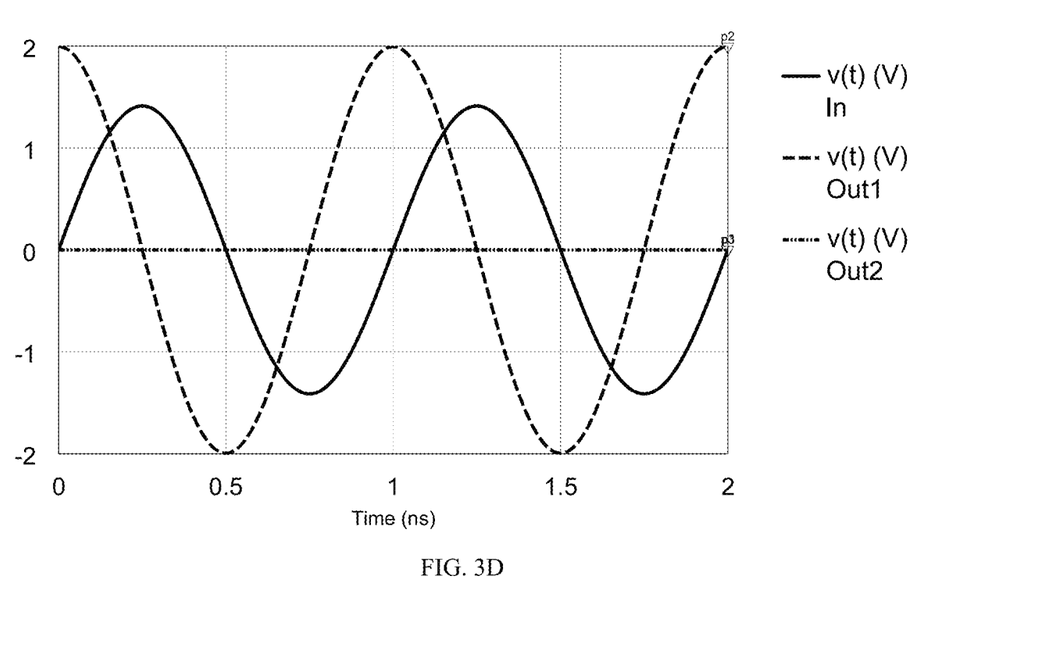

In addition, each signal contains half the power of "In" signal. If phase shifter 1, and 2 do not impose any phase shift (zero degree phase shifts), then $ii_1=i_1$, and $ii_2=i_2$. If the amplifiers provide 3 dB of gain, then we get $o_1$, and $o_2$, shown in FIG. 3B. Signal "In" is shown for reference. The output signals $Out_1$, and $Out_2$ are shown in FIG. 3C, where phase shifter 1, and 2 do not impose any phase shift, as before. Note that $Out_1$ is essentially zero while $Out_2$ is the sum of the powers in $o_1$, and $o_2$. FIG. 3D shows the output if phase shifter 1 imposes 270 degrees while phase shifter 2 imposes 90 degrees. This places $ii_1$ at 270 degrees and $ii_2$ at 180 degrees. They are still offset by 90 degrees, just reversed with respect to the input of the output quadrature hybrid coupler. Note, that in this case, $Out_2$ is essentially zero while $Out_1$ is the sum of the powers in $o_1$, and $o_2$. This demonstrates that controlling phase shifter 1, and 2 enables us to switch the output back and forth between $Out_1$, and $Out_2$. The amplifiers in FIG. 1 may be optional. Their role is to amplify the signal, as desired. The main function of the input quadrature hybrid coupler is to divide the signal, which may be equally. The fact that the quadrature hybrid coupler imposes a phase shift of 90-degrees is not critical given that phase shifters 1, and 2, can impose any phase shift that is desired. Thus, the input quadrature hybrid coupler could have been replaced with a 3 dB power divider (splits the signal equally) as shown in FIG. 2. The main function of the output quadrature hybrid coupler is to sum the signals into $Out_1$, and $Out_2$, depending on the relative shifts of signals $o_1$, and $o_2$. As such, it is clear that FIG. 1 and FIG. 2, shows an embodiment of a switching element. The input signal can be switched between $Out_1$, and $Out_2$ through controlling phase shifters 1, and 2. The switching circuit shown in FIG. 1 (and FIG. 2) has many advantages over traditional single pole double throw (SPDT) switches. First, the insertion loss should be lower since the combined losses of hybrid couplers, phase shifters, and power dividers are generally very low. Second, the switching speed should be much faster since phase shifters can be set much faster than SPDT switches. Third, the power handling should be greater since hybrid couplers, phase shifters, and power dividers tend to have much higher power handling capacity than SPDT switches.

The power is proportional to the square of the voltage. Hence, when the "In" signal power is divided equally between $i_1$, and $i_2$, the voltage amplitude of $i_1$, and $i_2$ equals $1/\sqrt{2}$ the amplitude of the "In" signal.

As I previously noted above, the '864 patent application introduced time folding power circuits using conventional switching elements. Those novel power combining circuits achieve peak power combining through time folding. As used herein, "time folding" refers to the process of segmenting a continuous repeating signal into a plurality of time slots, aligning the time slots for the segmented signals, and then combining them. The segmented signals are pulsed signals. Combining the time-aligned segmented signals, produces a pulsed signal with an increased peaked power. For instance, assuming an original continuous wave signal is split into two time segments, 50% duty-cycle signals, the output is a pulse signal with twice the peak power.

Utilizing the time folding technique lowers the output power specification requirement for RF amplifiers allowing designers to use lower power, lower cost, and more efficient amplifiers in pulsed RF systems. Thus, the technology allows designers to use lower power circuitry in their designs thereby saving cost and space. This technology may also be advantageous for radar and other systems which rely upon pulsed signals.

Figure 4:
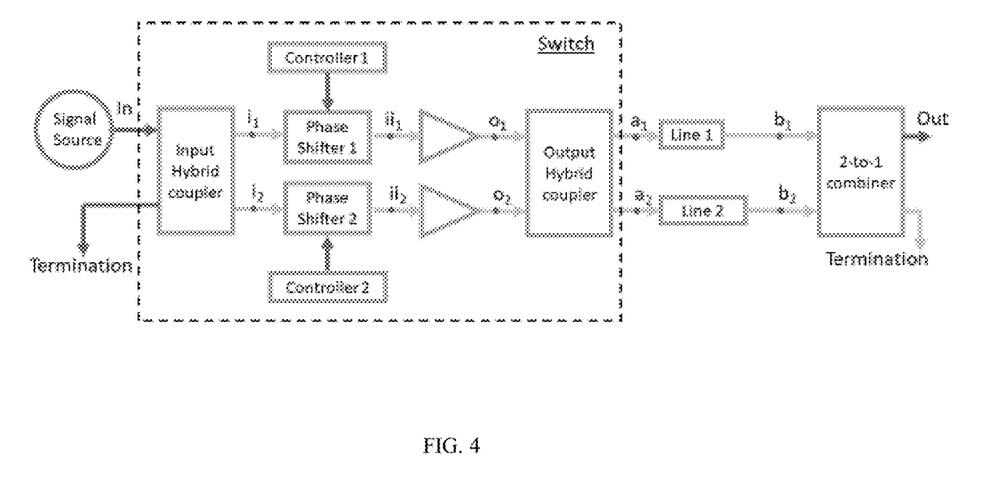
FIG. 4 shows a time folding power combiner circuit which uses a hybrid coupler-based electrical power switch according to an embodiment.

Based on the above use of hybrid couplers and the discussion of the switching circuits in FIGS. 1 and 2, I introduce other embodiment of the time folding power combiner. The first embodiment is shown in FIG. 4. The input CW signal is sent to quadrature hybrid coupler which divides signal into equal amplitude CW signals $i_1$, and $i_2$ that subsequently phase shifted (to become $ii_1$, and $ii_2$) using controllers 1, and 2, amplified to be $o_1$, and $o_2$ and combined into $a_1$ or $a_2$. By changing the relative phase shift between phase shifter 1, and 2, we can keep switching the output of the amplifiers to Line 1, or 2, and achieve time-folding power combining.

Figure 5:
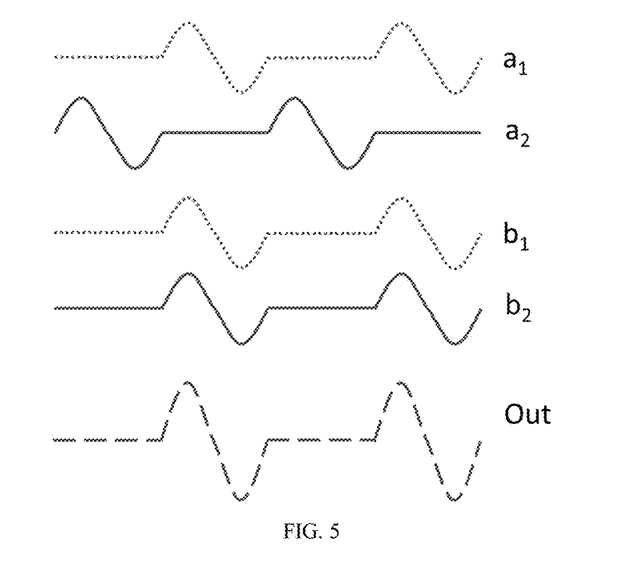
FIG. 5 shows a phase shifting scheme that can be used by the switch circuit of FIG. 4.

FIG. 5 shows a phase shifting scheme that can be used by the time folding power combiner circuit of FIG. 4. The operation of the time folding power circuits is essentially the same as discussed with respect to the FIGS. 12A-12G in the '864 patent application. The conventional switch in that application is replaced by the hybrid coupler-based electrical power switches according to embodiments disclosed herein. For a phase shifts of 0 degrees, in all time slots, that phase shifter could potentially be omitted. It shows the pulses it each path $a_1$ and $a_2$ and aligned as $b_1$ and $b_2$ using phase shifting so that they can sum. The phase shifters may have be associated with or have suitable controller. While separate controllers are shown in the drawings, a single controller may be used for both phase shifters/adjusters in some instances.

The delay line may be formed of a coaxial cable as a non-limiting example. The delay line may be bent, spooled, coiled, bundled, and/or wrapped, one or more times, between its beginning and end. The length of the delay Lines 1, and 2 may be determined according to Equations (1)-(5) in the '864 application. The only difference is that phase shifters 1, and 2 achieve the function of the 1-to-2 switch in the first embodiment. The advantage of this embodiment, over the first is that phase shifters and hybrid couplers typically have lower loss, and higher speed than the 1-to-2 switch. In addition, the phase shifters are on the input side of the amplifier instead of the output side (where the power is higher) which is advantageous. This is because it is easier to build components (phase shifters and/or switches) that handle low power instead of high power.

Figure 6:
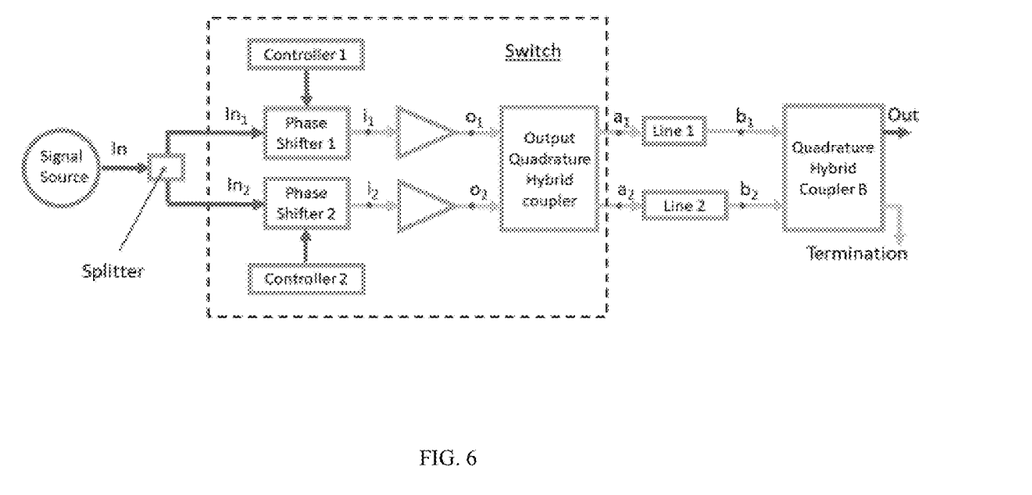
FIG. 6 shows a time folding power combiner circuit that uses a quadrature (90-degree) hybrid coupler-based power switch with another quadrature hybrid coupler used as a signal combiner according to an embodiment.

Alternatively, one can remove the input hybrid coupler in FIG. 4 and directly generate signals that are equivalent to $i_1$ and $i_2$. FIG. 6 shows an embodiment where $In_1$ and $In_2$ are generated directly (with the same amplitude and phase) and play the same role as $i_1$ and $i_2$ of FIG. 4.

In some embodiments, a splitter may be used to split the input signal from the source, each being ½ of the original input signal. For instance, the splitter may be a power divider like a Wilkinson power divider. One non-limiting example of a power splitter is the Minicircuit Model ZAPD-2-21-3 W-N+ splitter. It is a 2-Way DC Pass Power Splitter, which can operate over 700-2100 MHz at 50Ω. Alternatively, those skilled in the art will appreciate that one can directly generate signals that are equivalent to $i_1$ and $i_2$ from a signal source without using a splitter.

In this case, Phase Shifters 1, and 2, are adjusted such that the signals at $b_1$ and $b_2$ have a 90-degree offset such that they combine at one of the output ports of Hybrid coupler B while the other output port is terminated with a resistor such as a 50-ohm resistor. In FIG. 6, a second output quadrature hybrid coupler is used to combine or sum the signals in the two paths.

Figure 7:
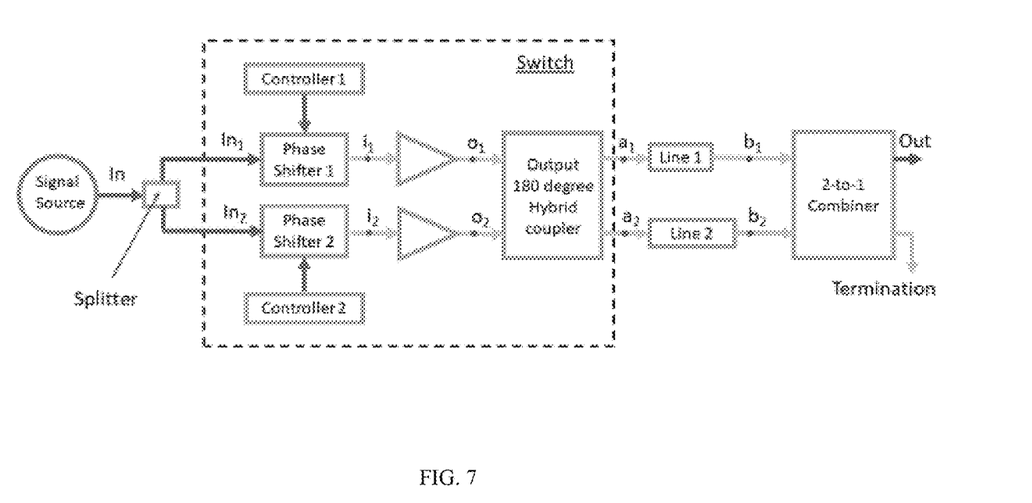
FIG. 7 shows a time folding power combiner circuit that uses 180-degree hybrid coupler-based power switch, and a 2-to-1 signal combiner according to an embodiment.

In other embodiments, we can replace the output quadrature hybrid coupler in FIG. 6 with a 180-degree hybrid coupler and 2-to-1-combiner and achieve the same time folding power combining provided the phase shifters 1, and 2 generate the appropriate phase. An embodiment of the time folding power combiner that uses a 180-degree hybrid coupler and 2-to-1 combiner is shown in FIG. 7. In this case, we generate the inputs ($In_1$, and $In_2$) directly. If $In_1$, and $In_2$ are equal in amplitude and phase, and phase shifters 1, and 2 have equal phase shifts, then the amplified power of $o_1$, and $o_2$, will sum at $a_1$, and no power will emerge out of $a_2$. On the other hand, if $In_1$, and $In_2$ are equal in amplitude and phase, and phase shifters 1, and 2 have a 180-degree relative phase shift, then the amplified power of $o_1$, and $o_2$, will sum at $a_2$, and no power will emerge out of $a_1$. The rest of the operation is the same as before. Namely, the aim is to generate signals like those shown in FIG. 5 where $a_1$ and $a_2$ are appropriately delayed (so as to align them in time as $b_1$ and $b_2$) and sum them.

Figure 8A:
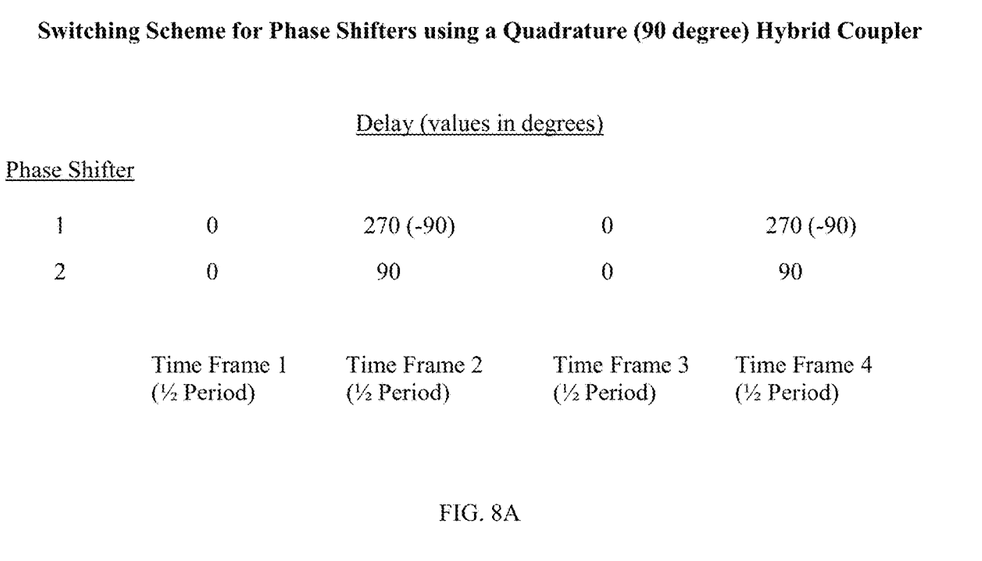
FIGS. 8A and 8B show switching scheming for the phase shifters used with the quadrature (90-degree) hybrid coupler and the 180-degree hybrid coupler, respectively.
Figure 8B:
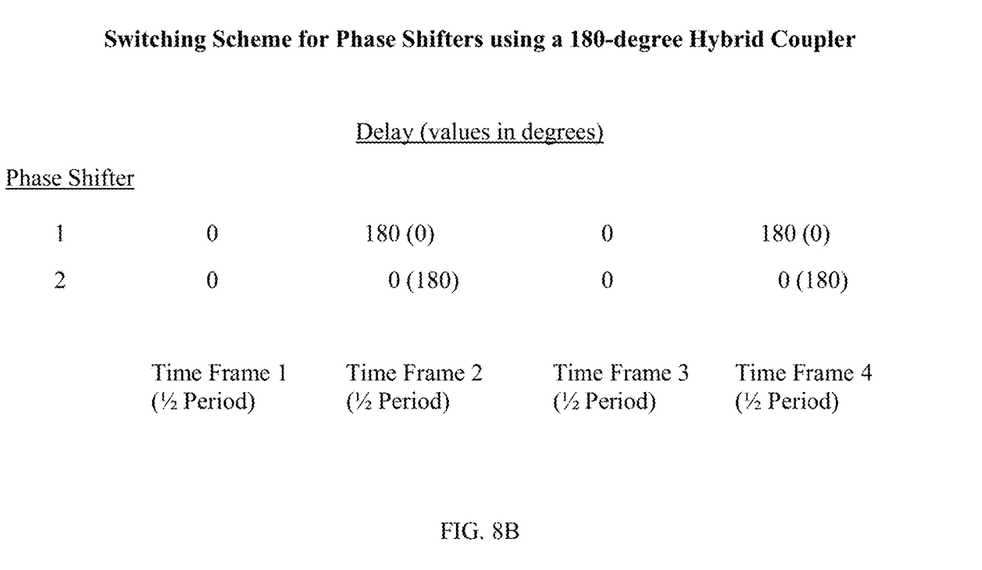

FIGS. 8A and 8B show switching scheming for the phase shifters used with the quadrature (90-degree) hybrid coupler (see FIGS. 4 and 6) and 180-degree hybrid coupler (see FIG. 7), respectively. In both, each time slot is ½ of the period of the input signal (e.g. 5 ns).

As shown in FIG. 8A, for a switch using the quadrature (90-degree) hybrid coupler(s), the phase in 1st time slot is 0, and 0 for phase shifters 1, and 2, respectively. The phase in $2^{nd}$ time slot is 270 (equivalent to −90), and 90 for phase shifters 1, and 2, respectively. The $3^{rd}$ time slot is a repeat of the $1^{st}$ time slot. The $4^{th}$ time slot is a repeat of the $2^{nd}$ and so on.

In FIG. 8B, for a switch using the 180-degree hybrid coupler, the phase shifts in 1st time slot would be 0, 0, respectively. In $2^{nd}$ time slot it would be 0, 180 (or alternatively 180, 0), respectively. The $3^{rd}$ time slot is a repeat of the $1^{st}$ time slot. The $4^{th}$ time slot is a repeat of the $2^{nd}$ and so on. As long as we shift one (or both) of them to enable switching between the two outputs of the hybrid couplers we should be good. In other words, we want to sum both inputs at $a_1$ (in 1st time slot, say), and then at $a_2$ (in $2^{nd}$ time slot, say).

They may also be used in cascading embodiments similar to FIG. 9 in the '864 patent application. Thus, a cascading circuit of time folding power combining circuits may be formed of: at least a first-time folding power combining circuit and second-time folding power combining circuit, connected in series with the output of the first time folding power combining circuit being the input to the second time folding power combining circuit. The peak power of the single combined pulsed wave signal output is approximately 2×M times that of the continuous wave signal input, wherein M is the number of cascaded time folding power combining circuits.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, and to describe the actual partial implementation in the laboratory of the system which was assembled using a combination of existing equipment and equipment that could be readily obtained by the inventors, to thereby enable others skilled in the art to best utilize the invention and various embodiments with various modifications as may be suited to the particular use contemplated.

While the foregoing is directed to embodiments of the present invention, other and further embodiments of the invention may be devised without departing from the basic scope thereof, and the scope thereof is determined by the claims that follow.

I claim:

1. A switch circuit for electrical power comprising:
an input hybrid coupler configured to receive a continuous wave signal as an input, and output first and second continuous wave signals along first and second signal output paths, respectively, of the input hybrid coupler in a plurality of time frames;
a phase adjuster provided in one or more of the first and second signal output paths of the input hybrid coupler to adjust the phase of the first continuous wave signal and/or the phase of the second continuous wave signal, wherein the phases of the first and second continuous wave signals along the first and second signal output paths are aligned; and
an output hybrid coupler to receive the first and second continuous wave signals along the first and second signal output paths of the input hybrid coupler as adjusted in phase and to output shifted pulsed signals along first and second signal output paths of the output hybrid coupler in said plurality of time frames.

2. The switch circuit of claim 1, wherein the input and output hybrid couplers comprise a quadrature (90-degree) hybrid coupler.

3. The switch circuit of claim 1, wherein another input of the input hybrid coupler is terminated to a resistive ground connection.

4. The switch circuit of claim 1, wherein the switch circuit further comprises an amplifier provided in each of the first and second signal output paths of the input hybrid coupler to amplify the signal therein.

5. A switch circuit for electrical power comprising:
a splitter to split a continuous wave signal into two continuous wave signals along first and second signal output paths, respectively;
a phase adjuster provided in one or more of the first and second signal paths to adjust the phase of the continuous wave signals therein; and
a hybrid coupler configured to receive the signals along the first and second signal output paths as adjusted in phase and to output first and second pulsed wave signals shifted in a plurality of time frames.

6. The switch circuit of claim 5, wherein the hybrid coupler comprises a 180-degree hybrid coupler.

7. A time folding power combining circuit comprising:
a switch circuit comprising:
(i) an input hybrid coupler configured to receive a continuous wave signal as an input, and output first and second continuous wave signals along first and second signal paths, respectively, of the input hybrid coupler in a plurality of time frames;
(ii) a phase adjuster provided in one or more of the first and second signal paths of the input hybrid coupler configured to adjust the phase of the first continuous wave signal and/or the phase of the second continuous wave signals, wherein the phases of the first and second continuous wave signals along the first and second signal paths are aligned; and
(iii) an output hybrid coupler to receive the first and second continuous wave signals along the first and second signal paths of the input hybrid coupler as adjusted in phase and to output shifted pulsed signals along first and second signal paths of the output hybrid coupler in said plurality of time frames;
a delay line in the second signal path configured to introduce a time delay to the second pulsed wave signal in the second signal path such that the first pulsed wave signal in the first signal path and the time-delayed second pulsed wave signal in the second signal path substantially align in the same time frames; and
a combiner, which receives the first pulsed wave signal in the first signal path and the time-delayed pulsed second wave signal in the second signal path as inputs, and combines them into a single combined pulsed wave signal as an output.

8. The time folding power combining circuit of claim 7, wherein the input hybrid coupler and the output hybrid coupler each comprises a quadrature (90-degree) hybrid coupler.

9. The time folding power combining circuit of claim 7, wherein the combiner comprises a 2-to-1 combiner.

10. The time folding power combining circuit of claim 7, further comprising: a continuous wave generator configured to produce the continuous wave signal.

11. The time folding power combining circuit of claim 10, wherein the continuous wave signal has a frequency between 1-10,000 MHz.

12. The time folding power combining circuit of claim 7, wherein the peak power of the single combined pulsed wave signal output is approximately twice that of a continuous wave signal input.

13. The time folding power combining circuit of claim 7, wherein the delay line comprises a coaxial cable.

14. The time folding power combining circuit of claim 13, wherein the delay line is bent, spooled, coiled, bundled, and/or wrapped, one or more times, between its beginning and end.

15. A time folding power combining circuit comprising:
a switch circuit comprising:
(i) a splitter to split a continuous wave signal into two continuous wave signals along first and second signal paths, respectively;
(ii) a phase adjuster provided in one or more of the first and second signal paths to adjust the phase of the continuous wave signals therein; and
(iii) a hybrid coupler configured to receive the signals along the first and second signal paths as adjusted in phase and to output first and second pulsed wave signals shifted in a plurality of time frames;
a delay line in the second signal path configured to introduce a time delay to the second pulsed wave signal in the second signal path such that the first pulsed wave signal in the first signal path and the time-delayed second pulsed wave signal in the second signal path substantially align in the same time frames; and
a combiner or an additional hybrid coupler, which receives the first pulsed wave signal in the first signal path and the time-delayed pulsed second wave signal in the second signal path as inputs, and combines them into a single combined pulsed wave signal as an output.

16. The time folding power combining circuit of claim 15, wherein the hybrid coupler of the switch circuit comprising a quadrature (90-degree) hybrid coupler, and an additional hybrid coupler is included which comprises a quadrature (90-degree) hybrid coupler.

17. The time folding power combining circuit of claim 15, wherein the hybrid coupler of the switch circuit comprising a 180-degree hybrid coupler, and a combiner is included which comprises a 2-to-1 combiner.

18. The time folding power combining circuit of claim 15, wherein the peak power of the single combined pulsed wave signal output is approximately twice that of a continuous wave signal input.

19. The time folding power combining circuit of claim 15, wherein the delay line comprises a coaxial cable.

20. The time folding power combining circuit of claim 19, wherein the delay line is bent, spooled, coiled, bundled, and/or wrapped, one or more times, between its beginning and end.

* * * * *